United States Patent [19]

Hanajima

[11] Patent Number: 5,335,068
[45] Date of Patent: Aug. 2, 1994

[54] GAMMA COMPENSATING CIRCUIT METHOD AND APPARATUS OF A COLOR TV CAMERA

[75] Inventor: Hiroshi Hanajima, Tokyo, Japan

[73] Assignee: Ikegami Tsushinki Co., Ltd., Tokyo, Japan

[21] Appl. No.: 767,587

[22] Filed: Sep. 30, 1991

[30] Foreign Application Priority Data

Oct. 2, 1990 [JP] Japan .................. 2-263203

[51] Int. Cl.⁵ .............................. H04N 9/69
[52] U.S. Cl. .................................. 348/674
[58] Field of Search ............ 358/32, 164, 30, 27, 358/166, 168, 169, 37, 184, 174; 330/295, 51; H04N 5/202, 9/69

[56] References Cited

U.S. PATENT DOCUMENTS

| 3,226,475 | 12/1965 | Percival | 178/5.4 |
|---|---|---|---|
| 3,358,130 | 12/1967 | Miura et al. | 235/197 |
| 4,000,366 | 12/1976 | Sirrine | 358/164 |
| 4,217,574 | 8/1980 | Anderson | 358/32 |
| 4,578,715 | 3/1986 | Yamaguchi | 358/457 |

FOREIGN PATENT DOCUMENTS

| 59-45775 | 3/1984 | Japan . |
|---|---|---|
| 63-92171 | 4/1988 | Japan . |
| 2-7552 | 2/1990 | Japan . |
| 620555 | 12/1978 | Switzerland . |

OTHER PUBLICATIONS

Rodriguez-Izquierdo et al, "High Gain Integrated Amplifiers Stabilize Function Generators", Annales De 'l Association International Pour Le Calcul Analogique, No. 4, Oct. 1971.
Analog Devices: "Data Acquisition Products Catalog", 19768, pp. 7-20: Operational Amplifiers, Analog Devices, Inc. Norwood, US, p. 19.

*Primary Examiner*—James J. Groody
*Assistant Examiner*—Sherrie Hsia
*Attorney, Agent, or Firm*—Lowe, Price, LeBlanc & Becker

[57] ABSTRACT

A nonlinear processing apparatus in which a common input signal is input to multiple amplifiers having mutually different amplification factors and different offset voltages and a non-adder/mixer selectively outputs the output of each amplifier selected for each level region of the input signal, thereby providing a final nonlinear output. It is therefore possible to independently set and adjust the output characteristic for each amplifier (the frequency response and offset voltage in the case where this invention is applied to a gamma compensator), thereby ensuring highly-accurate setting and adjustment of the output characteristic over the entire output level range.

7 Claims, 7 Drawing Sheets

GAMMA COMPENSATING CIRCUIT METHOD AND APPARATUS OF A COLOR TV CAMERA

BACKGROUND OF THE INVENTION (1) Field of the Invention

The present invention relates to a method and apparatus for a gamma compensation of a color camera.

(2) Description of the Related Art

In a color television apparatus, the level of an input frequency and the level of output light-emission of a cathode ray tube have a nonlinear relationship (gamma characteristic of the cathode ray tube). Therefore, a so-called gamma compensation or reverse-compensation for the gamma characteristic of the cathode ray tube is performed on the camera side, thereby providing an easy-to-see image.

The gamma compensation is carried out by changing the gain of an amplifier in accordance with the level of the input signal.

There is a conventional basic gamma compensator which acquires the input/output characteristic as an approximation of an inclination-changing line.

The conventional gamma compensator however has the following shortcomings.

First, the frequency responses for the operating portions corresponding to individual line segments which constitute the input/output characteristic cannot be determined independently. For instance, if one tries to perform adjustment to provide the best frequency response in a black level region where the signal level is low, the adjustment will affect the frequency response in a region where the signal level is high. Therefore this necessitates setting the frequency response in light of a balance over the whole level range, making it difficult to provide the optimal frequency response for each level range.

Secondary, it is necessary to take a wide dynamic range because an approximation is acquired by adding signals.

SUMMARY OF THE INVENTION

It is therefore a primary object of the present invention to provide a method and apparatus which can overcome the above conventional problems and can allow for easy and highly-accurate setting and adjustment to the desired nonlinear output characteristic.

It is another object of the present invention to permit the dynamic range of each constituent circuit to approach a usable range which is input output level as much as possible, thereby improving the durability and reliability and reducing the costs of parts, which results in reduction in the manufacturing cost.

It is further object of the present invention to allow for easy readjustment of a characteristic with respect to a change in the characteristic with passage of time even after the individual constituent circuits are assembled.

To achieve the above objects, according to one aspect of the present invention, there is provided a gamma compensating circuit apparatus of a color TV camera comprising Multiple amplifiers having mutually different amplification factors and different offset voltages and connected in such a way as to have input terminals supplied with a common input signal; plural independent voltage dividers connected to the output terminals of each amplifier and having different voltage-divided outputs; and a non-adder/mixer for independently receiving the voltage-divided outputs of the frequency dividers and selectively outputting the voltage-divided output of each of the voltage dividers selected for each level region of the input signal.

With the above structure, provides a gamma compensated output characteristic which shows the inclination of a continuous inclination-changing line becoming smaller in accordance with an approximation of a continuous inclination-changing line and an increase in the input signal level.

In addition, the amplifiers take their share of only part of the final output level range. With regard to the dynamic range of each amplifier, therefore, it is sufficient to secure the one corresponding to the share. Even for that amplifier which requires the maximum dynamic range, the dynamic range substantially the same as that of the final output is sufficient and each amplifier has only to hold a good output characteristic only in the output level region to be used, thus ensuring a good characteristic over the entire output level range although the output characteristics for those voltage dividers connected to the same amplifier cannot be adjusted independently, the output characteristics for those voltage dividers connected to different amplifiers can be adjusted independently so that the number of the amplifiers in use can be reduced, thus resulting in reduction of the manufacturing cost.

Each amplifier may be provided with a frequency response regulator. In this case, independent adjustment of the frequency response is possible in accordance with the frequency range of the input signal corresponding to the output region selected for each amplifier by the non-adder/mixer.

Each amplifier may be provided with an offset frequency regulator. Accordingly, the offset voltages can be adjusted independently of adjustment of the frequency response as well as for the respective amplifiers.

With the use of the offset voltage regulator, the regulator is usually set the offset voltage, which is the output voltage of the amplifier, corresponding to a part of the minimum value of the input signal level to zero.

DETAILED DESCRIPTION OF THE PREFERRED EMBODIMENTS

Preferred embodiments of the present invention will now be described referring to the accompanying drawings.

Figure 1:
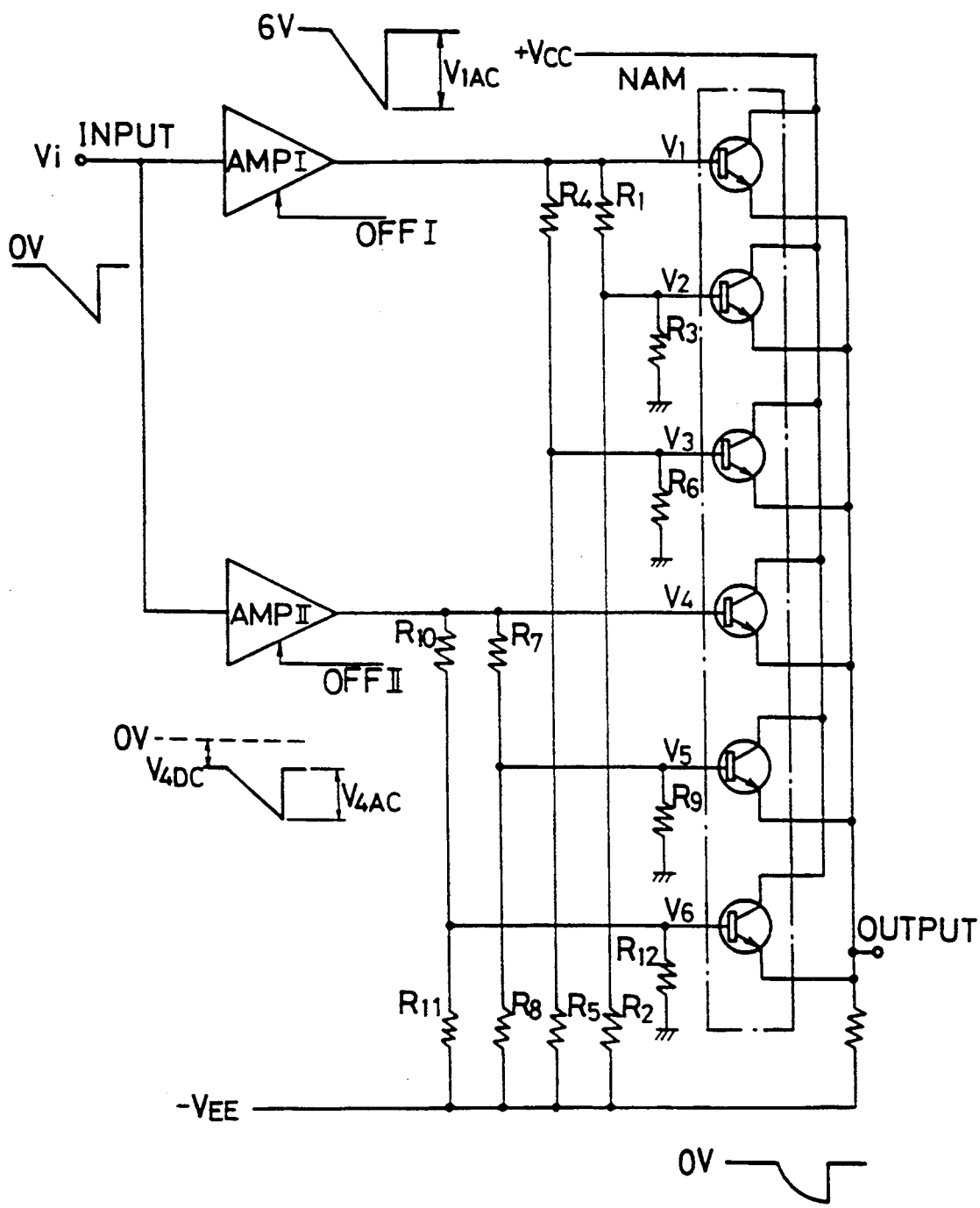
FIG. 1 is a circuit diagram illustrating the structure of the first embodiment of the present invention.

Referring to the diagram of FIG. 1, the gamma compensating circuit apparatus according to the present invention has its input terminal I connected with the input terminals of 2 amplifiers AMPT and MPII.

Figure 2:
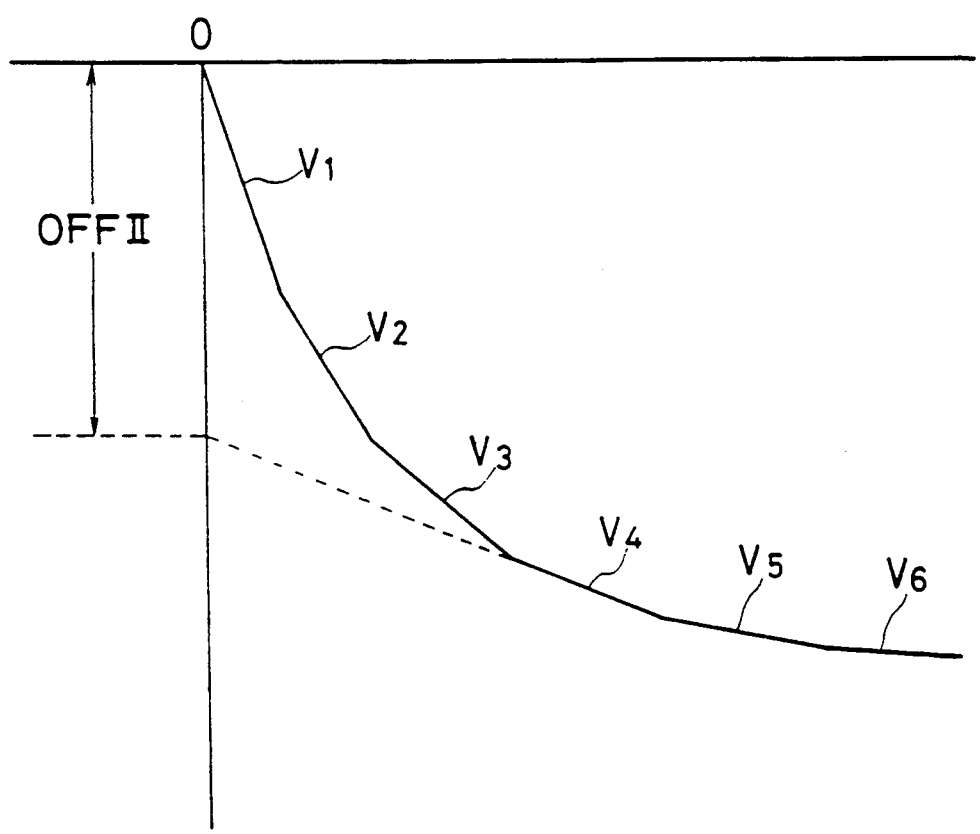
FIG. 2 is a characteristic diagram which illustrates the characteristic of this embodiment.

The amplifier AMPI and resistors $R_1$ to $R_6$ connected thereto are used to acquire three line output characteristics $V_1$ to $V_3$ (shown in FIG. 2) from the minimum level to the intermediate level, while an amplifier AMPII and resistors $R_7$ to $R_{12}$ connected thereto are used to acquire three line output characteristics $V_4$ to $V_6$ (shown in FIG. 2) from the intermediate level to the maximum level. The input signal $V_i$ and outputs $V_1$ to $V_6$ have a negative polarity and these outputs $V_1$–$V_6$ are input to the respective input terminals of a non-adder/mixer NAM.

According to the present invention, an emitter earthed circuit in which each collector of a plurality of transistors is connected with a line serves as a non-adder/mixer NAM. The output of the non-adder/mixer NAM corresponds to a voltage obtained by adding the voltage between the base and the emitter in NAM added to the output voltage of each amplifier.

In FIG. 1, let the DC potentials of $V_1$ to $V_6$ be $V_1DC$ to $V_6DC$, and let the AC components of the signal voltage be $V_{1AC}$ to $V_{6AC}$, where the set value OFFI of the offset voltage regulator is set so that the offset voltage $V_{1DC}$ corresponds to zero volt which is the same potential as the output reference potential. $V_{4DC}$ is the offset voltage of the amplifier AMPII, and the set value OFFII of offset voltage re regulator is set so that the offset voltage $V_{4DC}$ corresponds to a predetermined value. $V_{1AC}$ is determined by the gain $A_1$ of the amplifier AMPI ($V_{1AC}=A_1 \cdot V_i$), and $V_{4AC}$ is determined by the gain $A_{11}$ of the amplifier AMPII($V_{4AC}=A_{11} \cdot V_i$).

Figure 3:
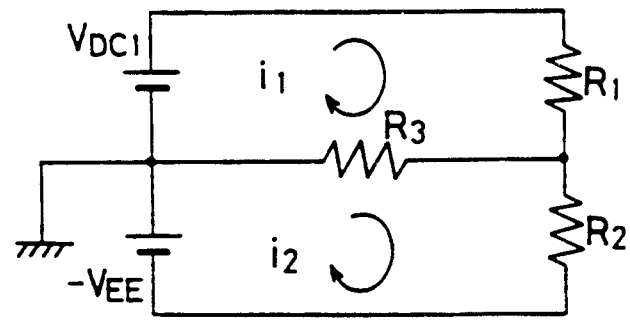
FIG. 3 is and equivalent circuit diagram for explaining the computation of voltage values of individual sections in the embodiment.

At this time, $V_{2DC}$–$V_{6DC}$ are acquired by performing calculation to be described later. First, $V_{2DC}$ will be acquired in the following manner. Let $i_1$ and $i_2$ be the individual loop currents in an equivalent circuit shown in FIG. 3.

Then, $$V_{1DC} = R_1 i_1 + R_3 i_1 - R_3 i_2$$
$$V_{EE} = -R_3 i_1 + R_2 i_2 + R_3 i_2$$

Solving the above for $i_1$ and $i_2$ yield $$i_1 = \frac{(R_2 + R_3)V_{1DC} + R_3 V_{EE}}{R_1 R_2 + R_2 R_3 + R_3 R_1}$$

$$i_2 = \frac{(R_3 + R_1)V_{EE} + R_3 V_{1DC}}{R_1 R_2 + R_2 R_3 + R_3 R_1}$$

Since $V_{2DC}$ is a voltage across $R_3$, $$\begin{aligned}V_{2DC} &= R_3(i_1 - i_2) \\ &= R_3\{(R_2 + R_3)V_{1DC} + R_3 V_{EE} - \\ &\quad (R_3 + R_1)V_{EE} - R_3 V_{1DC}\}/ \\ &\quad (R_1 R_2 + R_3 R_1) \\ &= R_3 \frac{R_2 V_{1DC} - R_1 V_{EE}}{R_1 R_2 + R_2 R_3 + R_3 R_1}\end{aligned}$$

Likewise, $$V_{3DC} = R_6 \frac{R_5 V_{1DC} - R_4 V_{EE}}{R_4 R_5 + R_5 R_6 + R_6 R_4}$$

$$V_{5DC} = R_9 \frac{R_8 V_{4DC} - R_7 V_{EE}}{R_7 R_8 + R_8 R_9 + R_9 R_7}$$

$$V_{6DC} = R_{12} \frac{R_{11} V_{4DC} - R_{10} V_{EE}}{R_{10} R_{11} + R_{11} R_{12} + R_{12} R_{10}}$$

Since $V_{1DC} = 0$, $$V_{2DC} = \frac{-R_3 R_1 V_{EE}}{R_1 R_2 + R_2 R_3 + R_3 R_1}$$

$$V_{3DC} = \frac{-R_6 R_4 V_{EE}}{R_4 R_5 + R_5 R_6 + R_6 R_4}$$

$V_{1AC}$ to $V_{6AC}$ are acquired through a similar computation. The results are as follows:

$$V_{1DC} = 0$$

$$V_{2DC} = \frac{-R_3 R_1 V_{EE}}{R_1 R_2 + R_2 R_3 + R_3 R_1}$$

$$V_{3DC} = \frac{-R_6 R_4 V_{EE}}{R_4 R_5 + R_5 R_6 + R_6 R_4}$$

$$V_{4DC} = V_{4DC}$$

$$V_{5DC} = R_9 \frac{R_8 V_{4DC} - R_7 V_{EE}}{R_7 R_8 + R_8 R_9 + R_9 R_7}$$

$$V_{6DC} = R_{12} \frac{R_{11} V_{4DC} - R_{10} V_{EE}}{R_{10} R_{11} + R_{11} R_{12} + R_{12} R_{10}}$$

$$V_{1AC} = A_1 V_i$$

$$V_{2AC} = \frac{R_2 R_3 V_{1AC}}{R_1 R_2 + R_2 R_3 + R_3 R_1}$$

$$V_{3AC} = \frac{R_5 R_6 V_{1AC}}{R_4 R_5 + R_5 R_6 + R_6 R_4}$$

$$V_{4AC} = A_{11} V_i$$

$$V_{5AC} = \frac{R_8 R_9 V_{4AC}}{R_7 R_8 + R_8 R_9 + R_9 R_7}$$

$$V_{6AC} = \frac{R_{11} R_{12} V_{4AC}}{R_{10} R_{11} + R_{11} R_{12} + R_{12} R_{10}}$$

Then, the values of $R_1$ to $R_{12}$ are determined so that $V_{1DC} > V_{2DC} > V_{3DC} > V_{4DC} > V_{5DC} > V_{6DC}$, and $V_{1AC} > V_{2AC} > V_{3AC} > V_{4AC} > V_{5AC} > V_{6AC}$.

By setting arbitrary values in this manner, approximation by an arbitrary inclination-changing line for non linear curve is possible.

As the characteristics of the amplifiers AMPI and AMPII can be independently set in this case, the frequency responses for the levels from the minimum level to the intermediate level, $V_1$, $V_2$ and $V_3$, and the frequency responses for the levels from the intermediate level to the maximum level, $V_4$, $V_5$ and $V_6$, can be independently set. This results in reduction in the manufacturing cost by the number of amplifiers reduced in comparison with a circuit having six amplifiers outputting $V_1$ through $V_0$, respectively. Since the frequency responses between $V_1$, $V_2$ and $V_3$ and those between $V_4$, $V_5$ and $V_6$ cannot independently be set, they have only to be selected in light of the cost and the required performance. The amplifiers may be increased in the apparatus of this embodiment type. For instance, a modification may be made so that for a total of six line characteristics, three amplifiers each can deal with two for the associated level, small, intermediate or large, or the number of amplifiers may be increased for a level region where the demand for the frequency response is high (generally, around the black level for a video image) to preponderantly cope with this region.

Further, since the non-adder/mixer NAM selectively outputs the output whose absolute value is minimum, the dynamic range can be narrowed.

Figure 4:
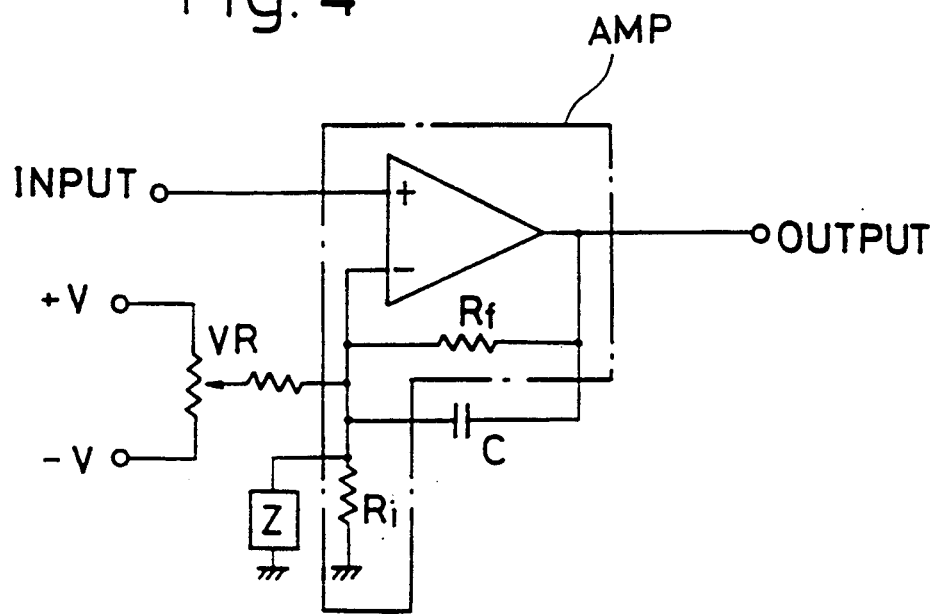
FIG. 4 is a circuit diagram exemplifying section of frequency response regulator and an offset voltage regulator in the embodiment.

A description will now be given of specific examples of the frequency response regulator and offset voltage regulator which are provided for each amplifier in the above-described embodiment. FIG. 4 illustrates an amplifier portion provided with such regulators. Although only one amplifier portion is shown in the diagram, the frequency response regulator and offset voltage regulator are actually provided, as mentioned above, for each amplifier in the individual embodiments discussed above.

Referring to FIG. 4 an amplifier element and resistors $R_i$ and $R_f$ located within the one-dot chain line constitute an amplifier AMP (a simplified illustration has been given in the foregoing description of each embodiment). As the frequency response regulator, and impedance adjusting element Z (constituted by, for example, a capacitor, a series circuit of a capacitor and a resistor or the like) may be connected between the negative (−) input terminal of the amplifier AMP and the ground, or capacitor C may be connected between the negative (−) input terminal and output terminal of the amplifier AMP. The impedance adjusting element Z and capacitor C may both be connected to the amplifier AMP as needed. It is to be noted that the impedance adjusting element Z serves mainly to increase the high-frequency level in a desired region, while the capacitor C serves to lower the frequency level over the entire output level range.

As the offset voltage regulator, a variable resistor VR is coupled to the negative input terminal of the amplifier AMP.

Figure 5:
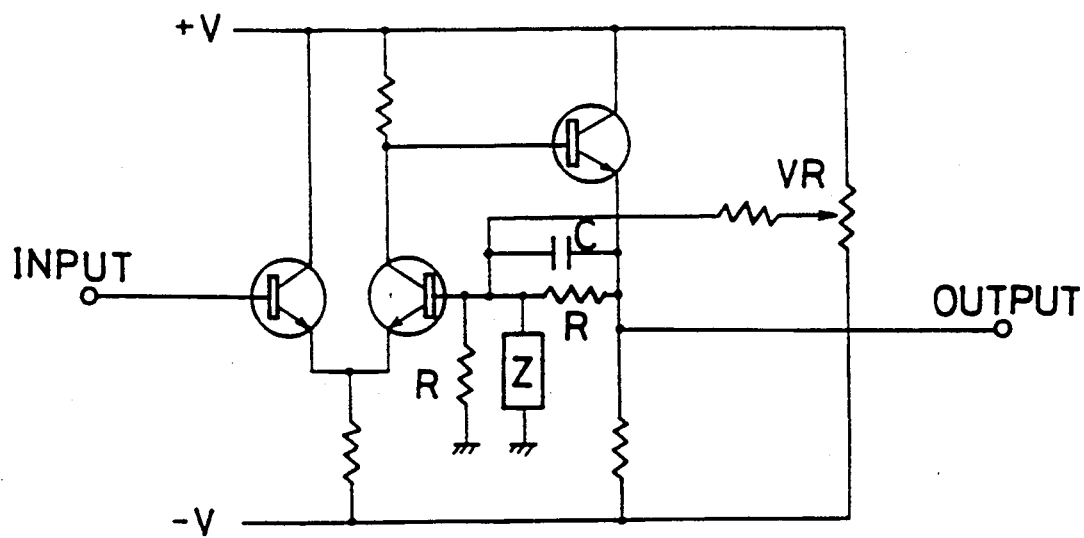
FIG. 5 is a circuit diagram showing another example of the section including the frequency response regulator and offset voltage regulator.

FIG. 5 illustrates an embodiment in which an amplifier comprises multiple transistors and multiple resistors. In this embodiment also, at least one of the impedance adjusting element Z or the capacitor C is coupled as needed to the illustrated location, and the variable resistor VR is coupled to a predetermined location as the offset voltage regulator.

The offset voltage regulator is freely adjustable by manipulating the variable resistor VR, and the frequency response regulator can also be adjusted even after the constituent elements are assembled if the impedance adjusting element Z and/or capacitor C is designed adjustable. In this case, needless to say, adjustment can be performed independently amplifier by amplifier and will not affect the other amplifiers.

If no adjustment is to be carried out after the constituent elements are assembled (normally, such is sufficient), the variable resistor VR may be changed to a fixed resistor.

What have been explained in the foregoing description are simply examples of the circuits to adjust the frequency response and offset voltage. It is well known that there are other numerous examples of such a circuit which can provide the same effects.

Further, the present invention is not limited to a gamma compensator as illustrated in the foregoing description of the individual embodiments, but may be applied to other circuits which execute nonlinear processing (mainly, image signal processing) as well.

Comparison Between Present Invention and Prior Art

Figure 6:
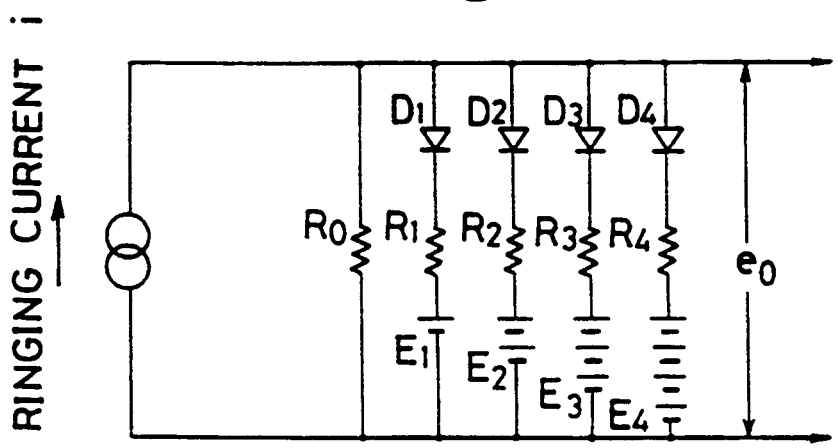
FIG. 6 is a circuit diagram of first prior art.

One conventional, fundamental gamma compensator is illustrated in FIG. 6; the gamma compensation characteristic of this circuit can be acquired by approximation of an inclination-changing line.

In FIG. 6 "i" denotes a signal current, "$E_1$", "$E_2$", "$E_3$", and "$E_4$" denote power supply voltage, "$R_0$", "$R_1$", "$R_3$" and "$R_4$" are resistors, and "$D_1$", "$D_2$", "$D_3$" and "$D_4$" are diodes.

Figure 7:
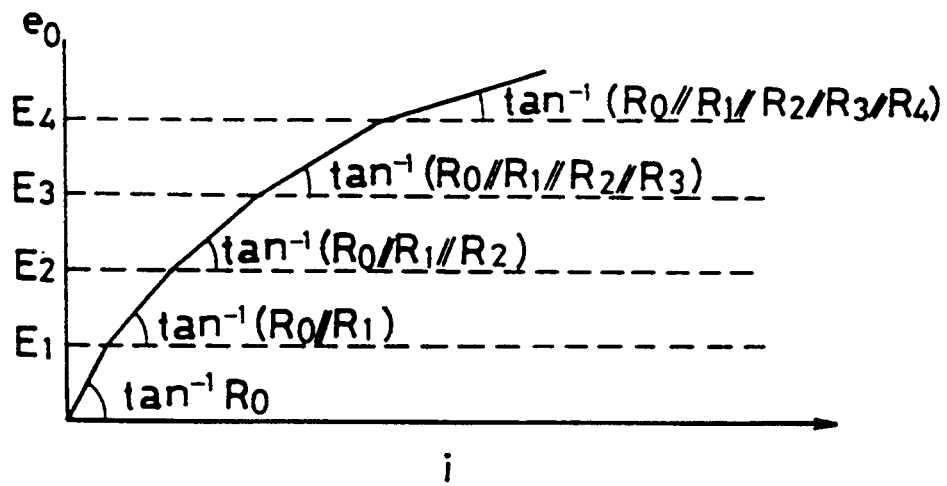
FIG. 7 is a characteristic diagram of the prior art.

In FIG. 7 presenting the line characteristic, "$E_1$", "$E_2$", "$E_3$", and "$E_4$" are voltages at points where the line inclination is changed, $\tan^{-1} R_0$, $\tan^{-1}(R_0//R_1)$, $\tan^{-1}(R_0//R_1//R_2)$, $\tan^{-1}(R_0//R_1//R_2//R_3)$, and $\tan^{-1}(R_0//R_1/R_2//R_3//R_4)$ are inclinations of the respective line segments where the symbol "//" represents a parallel resistance of the resistors.

After the bending-point voltages $E_1$, $E_2$, $E_3$, and $E_4$ the diodes $D_1$, $D_2$, $D_3$ and $D_4$ are sequentially rendered conductive and the resistors $R_1$, $R_2$, $R_3$ and $R_4$ are sequentially added. With the current source of this circuit considered in terms of the voltage source, the necessary dynamic range is $i \cdot R_0$.

Figure 8:
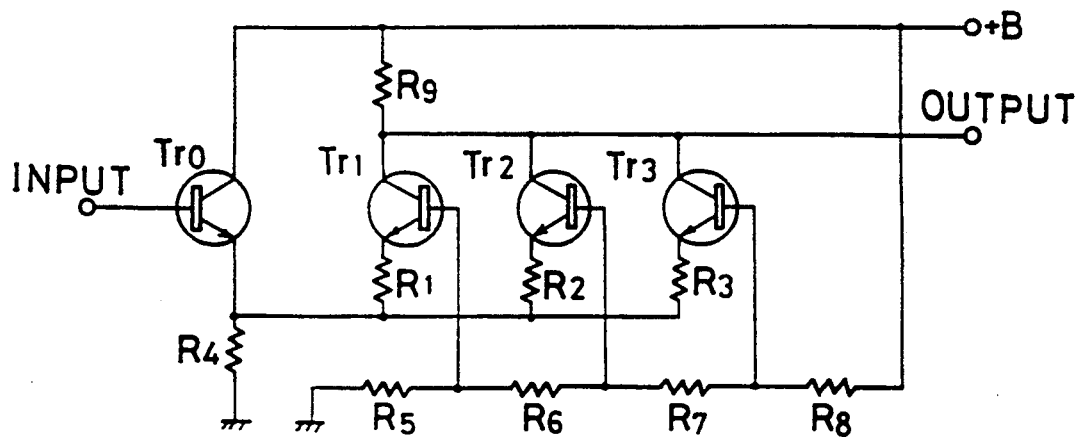
FIG. 8 is a circuit diagram of second prior art.

FIG. 8 illustrates another example of the gamma compensator employing the approximation of an inclination-changing line (refer to Published Examined Japanese Patent Application No. 7552/1990).

Figure 9:
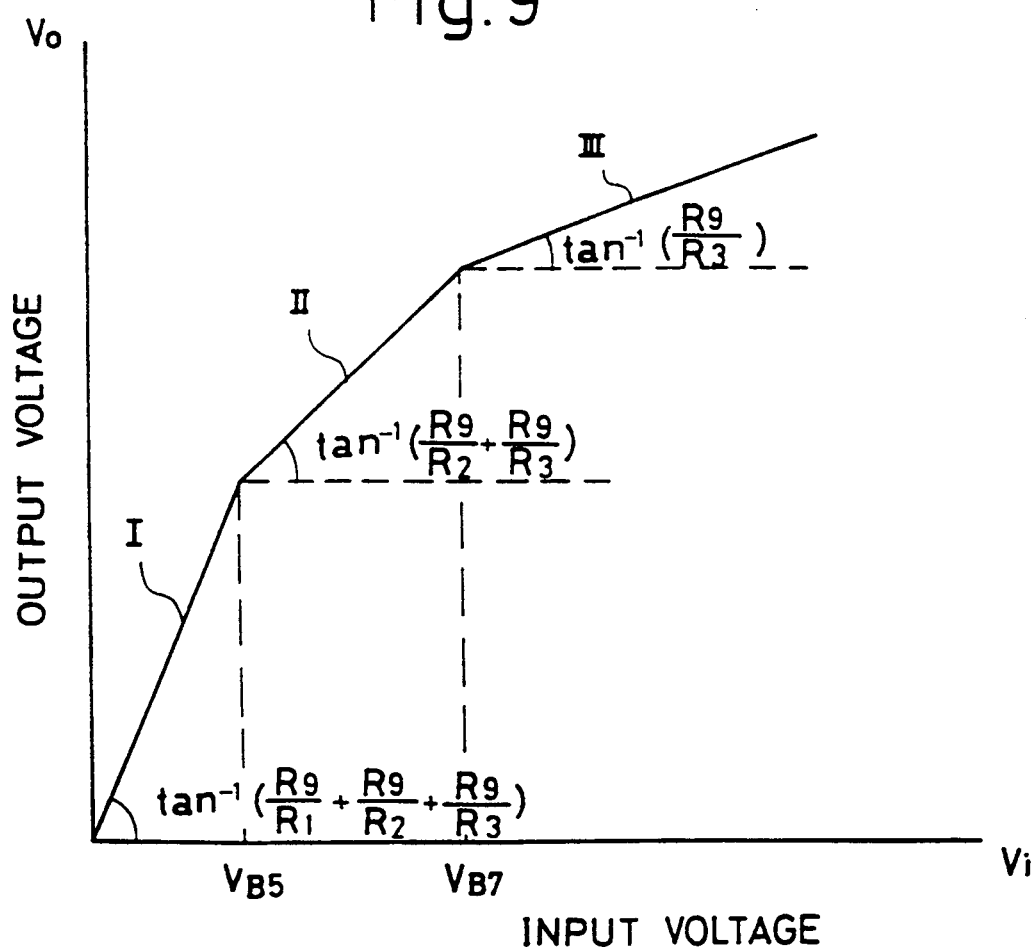
FIG. 9 is a characteristic diagram of the second prior art.

In this circuit, when the input signal voltage Vi rises, amplifiers $Tr_1$, $Tr_2$, and $Tr_3$ are sequentially cut off and consequently stop to add the each output sequentially (see FIG. 9).

The Following will discuss the problems of these conventional gamma compensators.

According to a fist technique of the prior art as shown in FIGS. 6 and 7, at first the frequency responses for the individual line segments cannot independently be determined as is apparent from the above formula of the line inclination. For instance, if one tries to perform adjustment to provide the best frequency response in a black level region where the signal level is low, the adjustment will affect the frequency response in a region where the signal level is high. It is therefore necessary to set the frequency response in light of a balance over the whole level range, so that the optimal frequency response for each level cannot be acquired.

Figure 10:
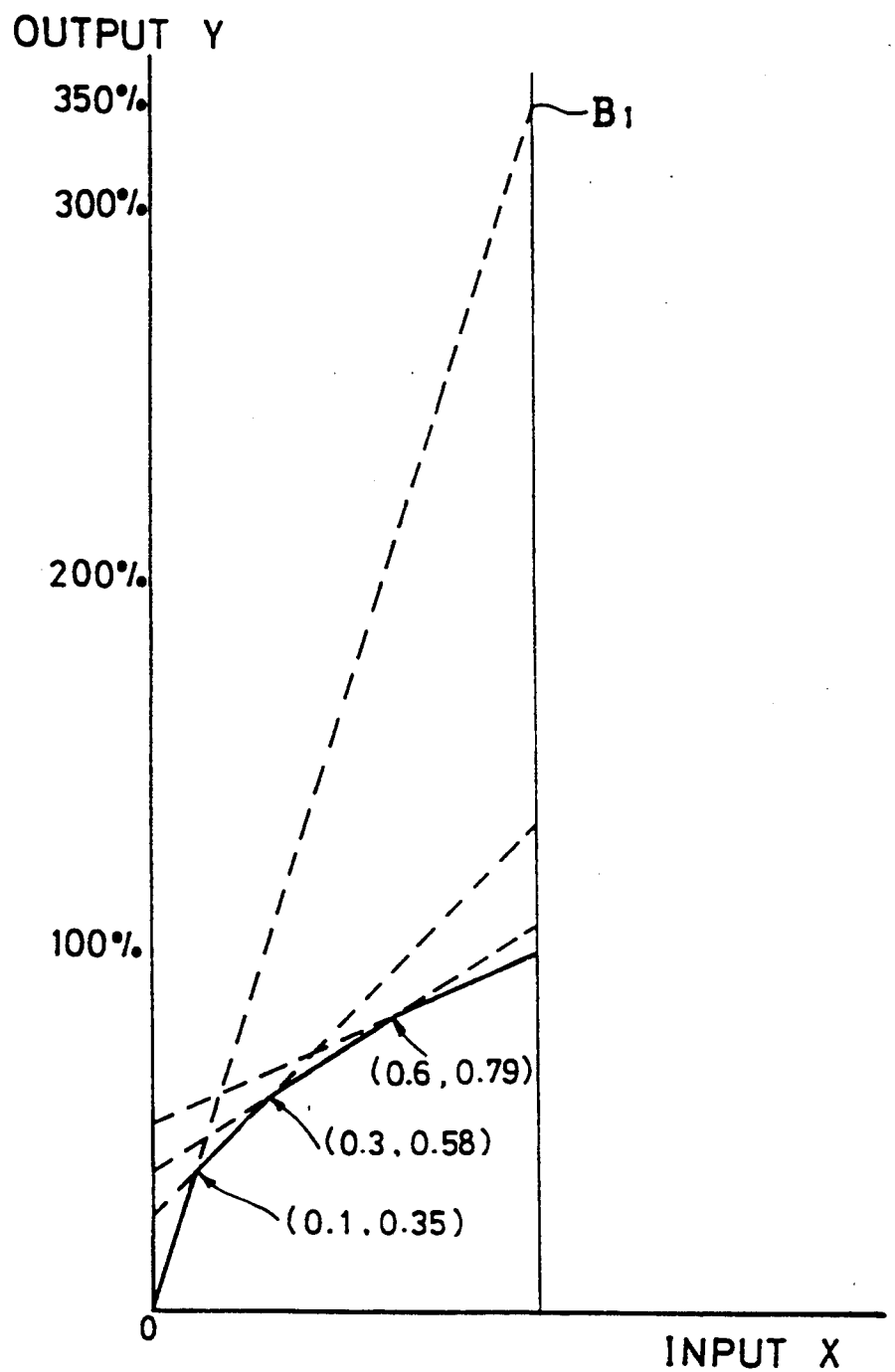
FIG. 10 is a characteristic diagram of the prior art.

Secondary, it is necessary to take a wide dynamic range because an approximation is acquired by adding signals. Let us consider a case where, referring to FIG. 10, a point (X, Y) on the graph of $Y = X^{0.45}$ is approximated so as to change at (0.1, 0.35), (0.3, 0.58), and (0.6, 0.79) in order to provide an approximation to a characteristic of $\gamma = 0.45$ or $Y = ^{0.45}$.

In this case, in order to obtain a signal with a 100% output level, the input level a signal source which may output B1 (350%) is needed. This is because and approximated straight line of (X,Y) connection (0,0) and (0.1, 0.35) yields Y=3.50 when the inclination is $\tan^{-1} R_0$ and X=1. In other words, the dynamic range required is $i \cdot R0 - 350\%$.

If the input signal is distorted at a level equal to or below B1, a distorted signal will be output because approximation is executed by adding signals.

Even in a second technique of the prior art shown in FIG. 8, since the outputs of $Tr_1$, $Tr_2$ and $Tr_3$ are added, the frequency responses in the individual level ranges cannot independently be adjusted as per the first prior art.

Like the first prior art, the second prior art takes an approximation of the gamma curve by adding signals, so that if one of the signals to be added is distorted due to clipping or the like, a distorted signal would be output.

For instance, if the inclination of the $-{}^1R_0$ shown in FIG. 7 equals the inclination of $\tan^{-1}(R_9/R_1+R_9/R_2+R_9/R_3)$ shown in FIG. 11 the dynamic range of 350% is necessary to acquire a signal with a 100% output level in the case illustrated in FIG. 9 as in the case of FIG. 7.

In contract, according to the present invention, since the characteristics of the individual line segments can be obtained by selectively switching and outputting the outputs of the individual amplifiers from one to another (unlike the prior art wherein the individual outputs of the amplifiers are added to be a final output), the characteristics of the individual line segments can independently be set or adjusted and the dynamic range can be designed narrower even though the circuit is designed as having a same output level.

What is claimed is:

1. A gamma compensating method for a color TV camera comprising the steps of:
   independently generating a plurality of output signals having different offset voltages from amplifiers having different amplification factors with respect to a common input signal;
   voltage dividing each of the plurality of output signals independently to provide a plurality of different voltage divided signals; and
   selectively outputting a voltage divided output, whose absolute value becomes minimum, selected for each level region of the input signal.

2. A gamma compensating circuit apparatus of a color TV camera comprising:
   multiple amplifiers having mutually different amplification factors and mutually different offset voltages, values of said amplification factors having an order which is reverse to an order of values of said offset voltages, said multiple amplifiers connected to have input terminals supplied with a common input signal;
   independent voltage dividers connected to output terminals of the amplifiers and having different voltage-divided outputs; and
   a non-adder/mixer for independently receiving the voltage-divided outputs of the voltage dividers and selectively outputting a voltage divided output, whose absolute value becomes minimum, selected for each level region of the input signal.

3. A gamma compensating circuit apparatus of a color TV camera according to claim 2, wherein each of the amplifiers comprises a frequency response regulator.

4. A gamma compensating circuit apparatus of a color TV camera according to claim 2, wherein each of the amplifiers comprises an offset voltage regulator.

5. A gamma compensation circuit apparatus of a color TV camera according to claim 4, wherein an offset voltage corresponding to a minimum value of an input signal level is set to zero.

6. A gamma compensating circuit apparatus of a color TV camera according to claim 2 wherein said independent voltage dividers function for acquiring an inclination-changing line characteristic from the input signal.

7. A gamma compensating method for a color TV camera in accordance with claim 1, wherein said step of independently voltage dividing comprises acquiring an inclination-changing line characteristic from the input signal.

* * * * *